(12) United States Patent
Shashkov et al.

(10) Patent No.: US 9,551,082 B2
(45) Date of Patent: Jan. 24, 2017

(54) INSULATED METAL SUBSTRATE

(75) Inventors: Pavel Shashkov, Suffolk (GB);
Gennady Khomutov, Moscow (RU);
Aleksey Yerokhin, Sheffield (GB);
Sergey Usov, Cambridge (GB)

(73) Assignee: CAMBRIDGE NANOTHERM LIMITED (GB)

( * ) Notice: Subject to any disclaimer, the term of this patent is extended or adjusted under 35 U.S.C. 154(b) by 690 days.

(21) Appl. No.: 13/984,126

(22) PCT Filed: Feb. 7, 2012

(86) PCT No.: PCT/GB2012/050269
§ 371 (c)(1),
(2), (4) Date: Oct. 18, 2013

(87) PCT Pub. No.: WO2012/107755
PCT Pub. Date: Aug. 16, 2012

(65) Prior Publication Data
US 2014/0293554 A1 Oct. 2, 2014

(30) Foreign Application Priority Data

Feb. 8, 2011 (GB) .................................. 1102174.8
Oct. 3, 2011 (GB) .................................. 1117002.4

(51) Int. Cl.
*H05K 1/18* (2006.01)
*C25D 5/18* (2006.01)
(Continued)

(52) U.S. Cl.
CPC ................ *C25D 5/18* (2013.01); *C25D 11/00* (2013.01); *C25D 11/005* (2013.01); *C25D 11/02* (2013.01);
(Continued)

(58) Field of Classification Search
CPC .......... H05K 1/18; H05K 1/181; H05K 1/115; H05K 1/021; H05K 1/053; H05K 2201/0116; H05K 2203/0315; H05K 2203/1147; C25D 11/02; C25D 5/18; C25D 11/00; C25D 11/005; C25D 11/024; C25D 11/026; C25D 11/04; C25D 11/06; C25D 11/26; C25D 11/30; C25D 11/32; C25D 13/02; C25D 15/00; C25D 21/12; H01L 23/142; H01L 23/3735; H01L 23/3677; H01L 2224/48227; H01L 2224/49109; H01L 2924/01327; H01L 2924/09701; H01L 2924/1305; H01L 2924/13055; Y10T 428/1317; Y10T 428/24917; Y10T 428/249969
(Continued)

(56) References Cited

U.S. PATENT DOCUMENTS 4,936,957 A  6/1990 Dickey et al.
5,066,368 A  11/1991 Pasqualoni et al.
(Continued)

FOREIGN PATENT DOCUMENTS

EA    012825    12/2009
EP    2371996    10/2011
(Continued)

OTHER PUBLICATIONS

Official Action with English Translation for Japan Patent Application No. 2013-552278, mailed Jun. 2, 2015, 14 pages.
(Continued)

*Primary Examiner* — Angel R Estrada
(74) *Attorney, Agent, or Firm* — Sheridan Ross P.C.

(57) ABSTRACT

An insulated metal substrate (IMS) for supporting a device comprises a metallic substrate having a ceramic coating
(Continued)

Figure 1:
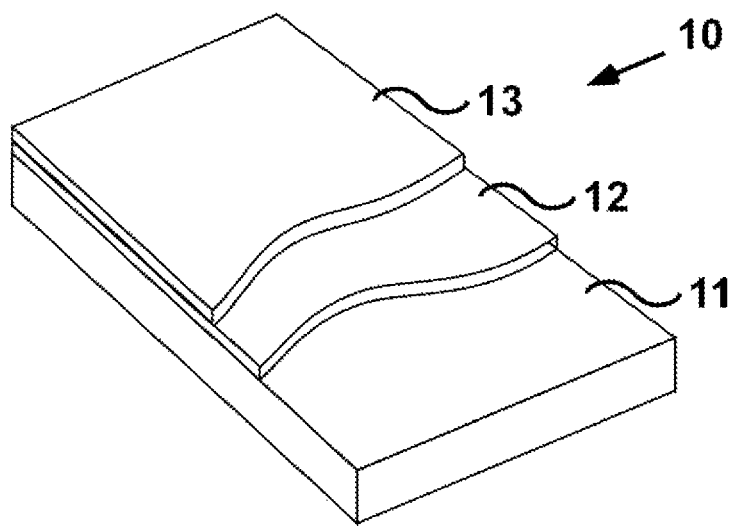

formed at least in part by oxidation of a portion of the surface of the metallic substrate. The ceramic coating has a dielectric strength of greater than 50 KV mm$^{-1}$ and a thermal conductivity of greater than 5 Wm$^{-1}$K$^{-1}$.

32 Claims, 10 Drawing Sheets

(51) Int. Cl.
| | |
|---|---|
| C25D 11/02 | (2006.01) |
| H05K 1/11 | (2006.01) |
| H05K 1/02 | (2006.01) |
| C25D 11/00 | (2006.01) |
| C25D 11/04 | (2006.01) |
| C25D 11/26 | (2006.01) |
| C25D 11/30 | (2006.01) |
| C25D 11/32 | (2006.01) |
| C25D 13/02 | (2006.01) |
| C25D 21/12 | (2006.01) |
| H01L 23/14 | (2006.01) |
| H05K 1/05 | (2006.01) |
| C25D 11/06 | (2006.01) |
| C25D 15/00 | (2006.01) |
| H01L 23/373 | (2006.01) |
| H01L 23/367 | (2006.01) |

(52) U.S. Cl.
CPC ........... *C25D 11/024* (2013.01); *C25D 11/026* (2013.01); *C25D 11/04* (2013.01); *C25D 11/06* (2013.01); *C25D 11/26* (2013.01); *C25D 11/30* (2013.01); *C25D 11/32* (2013.01); *C25D 13/02* (2013.01); *C25D 15/00* (2013.01); *C25D 21/12* (2013.01); *H01L 23/142* (2013.01); *H01L 23/3735* (2013.01); *H05K 1/021* (2013.01); *H05K 1/053* (2013.01); *H05K 1/115* (2013.01); *H05K 1/18* (2013.01); *H01L 23/3677* (2013.01); *H01L 2224/48227* (2013.01); *H01L 2224/49109* (2013.01); *H01L 2924/01327* (2013.01); *H01L 2924/09701* (2013.01); *H01L 2924/1305* (2013.01); *H01L 2924/13055* (2013.01); *H05K 2201/0116* (2013.01); *H05K 2203/0315* (2013.01); *H05K 2203/1147* (2013.01); *Y10T 428/1317* (2015.01); *Y10T 428/24917* (2015.01); *Y10T 428/249969* (2015.04)

(58) Field of Classification Search
USPC ....... 174/68.1, 252, 520, 260; 361/748, 750, 361/751; 428/312.6, 209, 34.6; 205/50; 257/659
See application file for complete search history.

(56) References Cited

U.S. PATENT DOCUMENTS

| | | | |
|---|---|---|---|
| 5,077,595 A * | 12/1991 | Fukunaga | H01L 23/142 257/659 |
| 5,486,280 A | 1/1996 | Bullock et al. | |
| 5,687,062 A | 11/1997 | Larson | |
| 5,688,606 A | 11/1997 | Mahulikar et al. | |
| 5,723,038 A | 3/1998 | Scharnweber et al. | |
| 6,248,612 B1 * | 6/2001 | Castro | H01L 23/24 438/106 |
| 6,373,705 B1 * | 4/2002 | Koelle | H01L 23/645 361/720 |
| 6,887,361 B1 | 5/2005 | Visco et al. | |
| 6,919,012 B1 | 7/2005 | Bucar | |
| 7,036,219 B2 | 5/2006 | He | |
| 7,780,838 B2 | 8/2010 | Ostrovsky | |
| 7,842,545 B2 * | 11/2010 | Lee | H01L 23/4334 438/106 |
| 8,069,559 B2 * | 12/2011 | Chun | H05K 1/056 29/831 |
| 8,804,339 B2 * | 8/2014 | Robert | H05K 1/0203 174/252 |
| 2008/0257585 A1 | 10/2008 | Morse | |

FOREIGN PATENT DOCUMENTS

| | | |
|---|---|---|
| GB | 2497063 | 10/2013 |
| GB | 2499560 | 1/2014 |
| JP | S55-65396 | 5/1980 |
| JP | H03-13593 | 1/1991 |
| JP | H11-43799 | 2/1999 |
| JP | H11-229187 | 8/1999 |
| JP | 2000-173975 | 6/2000 |
| JP | 2004-142177 | 5/2004 |
| JP | 2006-521473 | 9/2006 |
| JP | 2007-154302 | 6/2007 |
| JP | 2008-527733 | 7/2008 |
| JP | 2008-179901 | 8/2008 |
| JP | 2014-505174 | 2/2014 |
| WO | WO 96/24391 | 8/1996 |
| WO | WO 03/083181 | 10/2003 |
| WO | WO 2008/120046 | 10/2008 |
| WO | WO 2010/073916 | 7/2010 |

OTHER PUBLICATIONS

U.S. Appl. No. 13/984,096, filed Aug. 7, 2013, Shashkov et al.
International Search Report and Written Opinion for International (PCT) Patent Application No. PCT/GB2012/050268 mailed Jan. 3, 2013, 18 pages.
International Preliminary Report on Patentability for International (PCT) Patent Application No. PCT/GB2012/050268 mailed Aug. 22, 2013, 11 pages.
International Preliminary Report on Patentability for International (PCT) Patent Application No. PCT/GB2012/050269 mailed Aug. 22, 2013, 9 pages.
Informal Comments dated Mar. 5, 2013, in Response to the Written Opinion for International Application No. PCT/GB2012/050268.
Asquith et al., "Measurement of the Interfacial Shear Strength of a PEO Coated Aluminium Alloy," 17th European Conference on Fracture, Sep. 2008, pp. 2105-2111.
Curran et al., "Mullite-rich plasma electrolytic oxide coatings for thermal barrier applications", Surface & Coatings Technology, 2007, vol. 201, pp. 8683-8687.
Curran et al., "The thermal conductivity of plasma electrolytic oxide coatings on aluminium and magnesium," Surface & Coatings Technology, 2005, vol. 199, pp. 177-183.
Curran et al., "Thermo-physical properties of plasma electrolytic oxide coatings on aluminium," Surface & Coatings Technology, 2005, vol. 199, pp. 168-176.
Ogden, "Thermal Conductivity of Hard Anodized Coatings on Aluminum", AIAA/SAE/ASME/ASEE 23rd Joint Propulsion Conference, 1987, 6 pages.
Yerokhin et al., "Plasma electrolysis for surface engineering", Surface and Coatings Technology, 1999, vol. 122, pp. 73-93.
International Search Report and Written Opinion prepared by the European Patent Office on Aug. 1, 2012, for International Application No. PCT/GB2012/050269.
Keller et al: "Structural features of oxide coatings on aluminum", Journal of the Electrochemical Society, Electrochemical Society. Manchester, New Hampshire, US, vol. 100, No. 9, Jan. 1, 1953 (Jan. 1, 1953), pp. 411-419.
Information Statement (with English translation of the Notification) for Japanese Patent Application No. 2013-552277, mailed Jun. 30, 2015, 4 pages.
Official Action (with English translation ) for Japanese Patent Application No. 2013-552277, mailed Feb. 2, 2016, 12 pages.

* cited by examiner

INSULATED METAL SUBSTRATE

CROSS REFERENCE TO RELATED APPLICATIONS

This application is a national stage application under 35 U.S.C. 371 and claims the benefit of PCT Application No. PCT/GB2012/050269 having an international filing date of 7 Feb. 2012, which designated the United States, and which PCT application claimed the benefit of Great Britain Application No. 1102174.8 filed 8 Feb. 2011, and Great Britain Application No. 1117002.4 filed 3 Oct. 2011, the disclosure of which is incorporated herein by reference.

TECHNICAL FIELD

The invention relates to insulated metal substrates, for example insulated metal substrates as used to support electronic, optoelectronic, microwave, RF and electrical devices.

BACKGROUND

Electronic, optoelectronic, microwave, RF and electrical devices are typically mounted on substrates that provide support and act to remove heat from the device. The main requirements for such substrates are that they possess sufficient dielectric strength and a good thermal conductivity. A substrate on which such a device can be mounted is known as an insulated metal substrate (IMS).

Insulated metal substrates (IMSs) are typically used for electronic devices that generate high specific heat energy, for example in high power electronics, solid-state lighting, telecommunication and concentrated photovoltaic applications. IMSs usually comprise a metal sheet base covered from one side or two sides by an insulating layer of dielectric material, which may be polymeric, for example resin, fluoropolymer, polyimide and their composites charged with thermally conductive ceramic powders, etc. Such sheet IMS often named as Metal Core Printed Circuit Boards (MC PCB) then are usually attached to a heat think through a layer of thermal interface material.

In order to reduce thermal path a dielectric layer can be formed directly on a heat sink by use of anodising as described in GB 2162694, or Plasma Electrolytic Oxidation (PEO) as described in US Pat. 2008257585A1.

An IMS, which may be a metal board, a heat sink, a device body or supporting frame, requires dielectric material to have a high dielectric strength to secure electric insulation from circuitry of the device, thereby avoiding or preventing the device from short-circuiting. Thermal conductivity of dielectric material is also required to dissipate heat generated by the device, which negatively effects performance, reliability and the lifetime of the device. In general, an increased dielectric strength enables the IMS to have a thinner insulating layer, which is reducing IMS thermal resistance (with the same thermal conductivity of insulating material).

For RF and microwave applications it may be beneficial that an IMS comprises a dielectric material that has a high dielectric constant.

It is an aim of the invention to provide an IMS having improved properties.

SUMMARY OF THE INVENTION

The invention provides, in its various aspects, insulated metal substrates for supporting a device as defined in the appended independent claims to which reference should now be made. Preferred or advantageous features of the invention are set out in various dependent sub-claims.

In a first aspect, the invention may provide an insulated metal substrate (IMS) for supporting a device. The IMS comprises a metallic substrate having a ceramic coating formed at least in part by oxidation of a portion of the surface of the metallic substrate. The ceramic coating has a dielectric strength of greater than 50 KW/mm, and a thermal conductivity of greater than 5 W/mK.

Preferably, the thickness of the coating is less than 500 micrometers, preferably less than 100 micrometers. The thickness may be between 500 manometers and 500 micrometers. The coating preferably comprises one or more oxides of a metal component of the substrate.

In preferred embodiments, the coating has porosity, and pores defined in a surface of the non-metallic coating have an average size or average diameter of less than 500 manometers.

In a second aspect, the invention may provide an insulated metal substrate (IMS) comprising a ceramic coating of between 500 nanometers and 500 micrometers in thickness. The ceramic coating is formed, at least in part, by oxidation of a metallic substrate. The coating preferably comprises one or more oxides of a metal component of the substrate.

The coating has a crystalline structure having an average grain size of less than 500 nanometers. The coating has porosity, and pores defined in a surface of the coating have an average size or average diameter of less than 500 nanometers.

Ceramic coatings produced PEO techniques have pores of significantly greater size than 500 nanometers. By contrast, the nanoscale of the porosity on the IMS according to this aspect of the invention may contribute to various beneficial mechanical and electrical properties. For example, a low average pore diameter may improve the dielectric strength of a coating. A high dielectric strength may mean that the coating thickness required to achieve a predetermined minimum dielectric strength for any particular application is lowered, which in turn may improve the thermal conductivity of the coating. Furthermore, a lower pore size may also improve the thermal conductivity of the coating by improving the heat flow path through the coating.

Preferably, the pores of the coating have an average size of less than 400 nanometers, particularly preferably less than 300 nanometers.

The terms metallic and semi-metallic as used herein are intended to describe broad classes of material. Thus, these terms describe elemental metals such as pure aluminium or magnesium and elemental semi-metals such as silicon, as well as alloys of one or more elements, and intermetallic compounds. Practically, the substrates used in the methods of the invention are likely to be commercially available metallic or semi-metallic compositions.

Many metals may be suitable for use as a substrate on which the coating is formed to produce an IMS. Suitable materials may include those metals classed as valve metals. An IMS may be preferably formed from a substrate made from aluminium, magnesium, titanium, zirconium, tantalum, beryllium, or an alloy or intermetallic of any of these metals.

For IMS applications, the dielectric strength of a coating is of particular importance. The coating of an IMS according to any aspect of the present invention may, advantageously, provide a dielectric strength of between 50 and 120 kV $mm^{-1}$. Preferably, the coating provides a dielectric strength in the range of 60 to 100 kV $mm^{-1}$.

For IMS applications, it is preferred that the thermal conductivity of a coating is high. An insulating coating is required to provide electrical insulation between a working electronic component or device and a substrate, and simultaneously conduct heat away from this component into the substrate. It may be advantageous, therefore, that the coating of an IMS according to any aspect of the invention has a thermal conductivity of greater than 4 or 5 W/mK, for example between 4 and 15 W/mK. Preferably, the thermal conductivity is between 5 and 14 W/mK.

For some IMS applications it may be preferred that the dielectric coating has a high dielectric constant. A high dielectric constant may be particularly preferred when the IMS is intended to be used in RF or microwave applications. Preferably, the IMS comprises a dielectric coating with a dielectric constant greater than 7. Preferably the dielectric constant is greater than 7.5 or greater than 8. Preferably, the dielectric coating is between 7 and 12, for example between 7.5 and 10.

Many physical properties of ceramic coatings formed on a metal substrate are dependent to some extent on the crystallite size or grain size of the ceramic coating.

Preferably, a coating of an IMS according to the any aspect of the present invention is a crystalline ceramic coating, and preferably the coating comprises grains having an average diameter of less than 200 nanometers, particularly preferably less than 100 nanometers, for example about 50 nanometers or 40 nanometers. Grains may be alternatively referred to as crystals or crystallites. Thus, a preferred embodiment of an IMS may comprise a coating that may be described as a nanostructured coating, or a nanoceramic coating, as it has physical features that have a size or dimensions on the nanometer scale. Fine grain sizes may improve structural homogeneity and properties such as hardness, wear resistance. Fine grain sizes may also increase thermal conductivity, dielectric strength and dielectric constant of a ceramic material. A smoother surface profile may also be developed as a result of the fine grain size.

A coating formed on a metal substrate by an anodising process tends to be highly porous. Anodised coatings also usually have an amorphous structure (i.e. anodised coatings are rarely crystalline) and an open, column-like structure. The regular column-like structure of a typical anodic coating may render the coating susceptible to the formation of cracks, particularly after thermal cycling of the coating. The susceptibility to crack formation limits the application of anodic coatings in power devices. In particular, an IMS in which the dielectric layer has been formed by an anodic coating process is generally limited to low power applications in which the thermal cycling of the coating may be minimised. Thus, while an IMS having a dielectric coating formed by an anodising process may be suitable for many low power applications, such coatings do not have a sufficient voltage withstand or thermal conductivity for high power applications.

Coatings produced by PEO processes are crystalline, but suffer in that the average porosity size is high. This limits the dielectric properties and thermal conductivity.

Some advanced IMSs are produced using dielectric coatings based on ceramic filled polymers having a high thermal conductivity of up to 3 W/mK. This high thermal conductivity is due to the presence of relatively large ceramic particles in the material. The minimal thickness obtainable by the use of insulating layers of this material is limited, however, due to the presence of the ceramic particles. For example, a coating of an IMS material produced by Bergquist™ has a minimal thickness of 38 microns. Dupont™ produces an IMS with a polyimide based dielectric material having a minimal thickness of 17 microns. IMSs according to any aspect of the present invention may be formed with a dielectric coating that is thinner than 17 micrometers, where such coating thickness is desirable.

TABLE 1

A comparison of dielectric layer properties between the coating of the present invention and other known dielectrics.

| IMS Dielectric | Thermal conductivity (W/mK) | Dielectric strength (kV/mm) | Thickness (microns) | Max operating temperature (° C.) |
|---|---|---|---|---|
| Dielectric (nanoceramic) coating for an IMS according to an aspect of the invention | 5-14 | 50-120 | 2-100 | 600 |
| Filled Epoxy | 3 | 66 | 38 | 140 |
| Filled Polyimide | 0.8 | 130 | 17 | 130 |
| Anodic coating | 0.7-1.3 | 8-50 | 35 | 400 |
| PEO coating | 1.6 | 27-37 | 15-80 | 500 |

A comparison between the dielectric properties of IMS coatings formed on IMSs according to specific embodiments of the present invention, and other known dielectric coatings is provided in table 1 above.

An IMS according to any aspect of the present invention is preferably an IMS for supporting an electronic device, an optoelectronic device, a microwave or RF device or an electrical device. The thickness of the non-metallic coating is preferably less than 40 micrometers, and particularly preferably less than 20 micrometers or less than 10 micrometers. The thinner the coating the more effective the thermal transfer across the coating, and thus it may be particularly advantageous if the coatings have thicknesses even lower, for example in the range 1 or 2 micrometers to 10 micrometers.

An IMS according to an embodiment of the invention may preferably have a coating thickness of less than 11 microns, the coating having a breakdown voltage greater than 500 V DC, and a thermal resistance of less 0.02° C. cm$^2$/W.

An IMS according to an embodiment of the invention may have a coating with thickness less than 31 micrometers, a breakdown voltage of greater than 1.5 KV DC and thermal resistance lower 0.07° C. cm$^2$/W.

An IMS according to any aspect of the invention may comprise a dielectric coating that has been applied selectively to a portion of a metal or semi-metal substrate or component. The substrate or component may be of any desired shape, and may form a component such as a flat board, a heat-sink, a heat pipe, a cooling device, or a luminary frame or body. The substrate or component on which the coating is to be formed may be, for example, masked such that the coating is only applied to a predetermined region where dielectric functionality is desired.

It may be desirable to fill any pores that exist in the coating. Thus, an IMS according to any aspect of the invention may comprise a dielectric coating that has been sealed or impregnated by a suitable organic or inorganic material to fill any pores in the coating. A suitable sealing material may be, for example, a resin, a fluoropolymer, a polyimide, a methacrylate, a polyester, a water glass, or a sol-gel material. This list of suitable sealing materials is not exhaustive and the skilled person would be able to identify other suitable materials. Sealing materials may be applied to the coating by a number of known methods, for example by dipping, spraying, vacuum sealing, and PVD and CVD deposition techniques.

An IMS according to any aspect of the invention may further comprise metal contact layers or areas formed on a surface of the coating. Such contact layers or areas may be provided by any conventional techniques such as screen printing, metal ink printing, electroless metallisation, galvanic metallisation, adhesive bonding of metal foil, bonding of pre-fabricated flex circuits, chemical vapour deposition (CVD) and plasma vapour deposition (PVD) metallisation.

Metal contact layers may be formed by the use of thermally conductive adhesives to bond metallic foils, such as copper foils, or pre-fabricated flex circuits to the coating formed as described above. Suitable thermally conductive adhesives may include resins, polyimides or fluoropolymers and others for bonding a metal layer to the surface of the coating. Bonding using adhesives may be accompanied by penetration of the bonding material into any pores of the coating. This penetration may create a composite dielectric layer having an increased breakdown voltage.

An IMS according to any aspect of the invention may comprise metal thermal vias connecting a metal contact layer formed on a surface of the non-metallic coating with the metallic or semi metallic substrate. Such vias may be formed by a masking process prior to the formation of the coating. Vias may be formed by an etching process after the coating has been formed or by laser ablation of ceramic layer.

While many metals may be used as the substrate for the IMS, it is preferred that the substrate is selected from a group of materials comprising aluminium, magnesium, titanium, zirconium, tantalum, beryllium, or an alloy or intermetallic of any of these metals.

A preferred embodiment of an IMS according to an aspect of the invention may comprise a metallic substrate having a ceramic coating formed at least in part by electrolytic oxidation of a portion of the surface of the metallic substrate, in which the ceramic coating has a dielectric strength of greater than 50 KV mm$^{-1}$, a thermal conductivity of greater than 5 W m$^{-1}$ K$^{-1}$, a thickness of between 500 nanometers and 500 micrometers and a crystalline structure having an average grain size of less than 500 nanometers, and in which pores defined in a surface of the ceramic coating have an average diameter of less than 500 nanometers.

A preferred embodiment of an IMS according to an aspect of the invention that is particularly suitable for RF or microwave applications may comprise a metallic substrate having a ceramic coating formed at least in part by electrolytic oxidation of a portion of the surface of the metallic substrate, in which the ceramic coating has a dielectric strength of greater than 50 KV mm$^{-1}$, a thermal conductivity of greater than 5 W m$^{-1}$ K$^{-1}$, a thickness of between 500 nanometers and 500 micrometers, a crystalline structure having an average grain size of less than 500 nanometers, and a dielectric constant greater than 7, and in which pores defined in a surface of the ceramic coating have an average diameter of less than 500 nanometers To form an IMS according to any aspect of the invention a non-metallic coating possessing the desired properties is formed on a metallic or semi-metallic substrate. Metallic contact layers, tracks and pads may then be formed on the non-metallic coating if, or as, required.

A preferred method of forming an IMS according to an aspect of the invention comprises the steps of positioning a metallic or semi-metallic substrate in an electrolysis chamber containing an aqueous electrolyte and an electrode. At least the surface of the substrate on which it is desired to form a crystalline ceramic coating and a portion of the electrode are in contact with the aqueous electrolyte. The substrate may be, for example, shaped as a heat sink, and may comprise a flat surface on which it is desired to form the coating.

The method comprises the further step of electrically biasing the substrate with respect to the electrode by applying a sequence of voltage pulses of alternating polarity for a predetermined period. Positive voltage pulses anodically bias the substrate with respect to the electrode and negative voltage pulses cathodically bias the substrate with respect to the electrode. The amplitude of the positive voltage pulses is potentiostatically controlled, that is controlled with respect to voltage, and the amplitude of the negative voltage pulses is galvanostatically controlled, that is controlled by reference to current.

By applying a sequence of voltage pulses of alternating polarity in which positive pulses are potentiostatically controlled and negative pulses are galvanostatically controlled, it is possible to apply pulses of high voltage to the substrate without inducing substantial levels of micro-discharge. By minimising or avoiding micro-discharge events during the formation of the non-metallic coating, it may be possible to control coating parameters such as the surface roughness and the magnitude of the coating porosity. Thus, by controlling this process a coating may be formed having an average pore size lower than 500 nanometers, if desired.

It may be advantageous for the positive and negative voltage pulses to be shaped to avoid the development of current spikes during each voltage pulse. Current spikes are associated with the breakdown of the coating and with micro-discharge. By shaping the voltage pulses to avoid current spikes, micro-discharge may be reduced significantly or eliminated. Micro-discharge, as discussed above in relation to prior art PEO coating techniques, has a deleterious effect on a number of coating properties, for example on the average pore size of the coating and, as a consequence, on the dielectric strength of the coating.

It may be particularly advantageous if the shape of one or both of the positive and negative voltage pulses is substantially trapezoidal in shape.

The conversion of material in the substrate to form a ceramic coating occurs during the positive voltage pulses in which the substrate is anodically biased with respect to the electrode. The coating is formed as oxygen containing species in the aqueous electrolyte react with the substrate material itself. Over successive positive voltage pulses the non-metallic coating increases in thickness. As the coating increases in thickness the electrical resistance of the coating increases and less current flows for the applied voltage. Thus, while it is preferred that the peak voltage of each of the positive voltage pulses is constant over the predetermined period, the current flow with each successive voltage pulse may decrease over the predetermined period.

As the coating grows in thickness, the resistance of the coating increases and, therefore, the current passing through the coating during each successive negative voltage pulse causes resistive heating of the coating. This resistive heating during negative voltage pulses may contribute to increased levels of diffusion in the coating, and may therefore assist the processes of crystallisation and grain formation within the developing coating. By controlling the formation of the ceramic coating in this manner, preferably in which micro-discharge is substantially avoided, a dense coating may be formed having crystallites or grain size of extremely fine scale. Preferably, the grain size of the coating formed is less than 200 nanometers, particularly preferably less than 100 nanometers, for example less than 50 nanometers.

The term grain size refers to the distance across the average dimension of a grain or crystal in the coating.

The pulse repetition frequency of the voltage pulses may be between 0.1 and 20 KHz, preferably between 1.5 and 15 KHz, or between 2 and 10 KHz. For example, advantageous pulse repetition frequencies may be 2.5 KHz or 3 KHz or 4 KHz. At low pulse repetition frequencies the coating undergoes long period of growth followed by long periods of ohmic heating. The resulting coating may, therefore, have a more coarse structure or surface profile than if a higher pulse repetition frequency were to be used. Higher pulse repetition frequencies may produce finer structures and smoother coating surfaces, but coating rates and efficiency of the process may decrease.

It may be advantageous if the method is carried out in an electrolyte that is an alkaline aqueous solution, preferably an electrolyte having a pH of 9 or greater. Preferably, the electrolyte has an electrical conductivity of greater than 1 mS cm$^{-1}$. Suitable electrolytes include alkaline metal hydroxides, particularly those comprising potassium hydroxide or sodium hydroxide.

It may be particularly advantageous if the electrolyte is colloidal and comprises solid particles dispersed in an aqueous phase. Particularly preferably the electrolyte comprises a proportion of solid particles having a particle size of less than 100 nanometers.

Particle size refers to the length of the largest dimension of the particle.

An electric field generated during the applied voltage pulses causes electrostatically charged solid particles dispersed in the aqueous phase to be transported towards the surface of the substrate on which the non-metallic coating is growing. As the solid particles come into contact with the growing ceramic coating they may react with, and become incorporated into, the coating. Thus, where a colloidal electrolyte is used the coating may comprise both ceramic material formed by oxidation of a portion of the surface of the metallic substrate and colloidal particles derived from the electrolyte.

The coating forming on the substrate is generated during the positive, anodic, voltage pulses. In order for the coating to grow a connection needs to be maintained between the substrate material and the electrolyte. The growing coating is not fully dense, but has a degree of porosity. The connection between the substrate material and the electrolyte is maintained via this porosity. Where the electrolyte is colloidal and comprises solid particles the porosity that is inherent in the formation of the ceramic coating may be substantially modified. Non-metallic solid particles dispersed in the aqueous phase may migrate under the electric field into pores of the growing coating. Once within the pores the solid particles may react, for example by sintering processes, with both the coating and with other solid particles that have migrated into the pores. In this way the dimensions of the pores are substantially reduced and the porosity of the coating is altered develops as nanoporosity. For example, the maximum dimensions of pores in the coating may be reduced from 1 or more micrometers across to less than 400 nanometers across or less than 300 nanometers across.

By reducing the porosity the density of the coating is increased. Furthermore, the reduction in the dimensions of the porosity through the coating may substantially increase the dielectric strength and thermal conductivity of the coating.

The electrolyte may comprise solid particles that are present from the start of the process, i.e. the particles may be initially present in the electrolyte solution. Alternatively, solid particles may be added to the aqueous electrolyte during the coating process. In this way, the composition and/or structure of the growing coating may be controlled while the coating is growing.

It is preferred that the solid particles are ceramic particles, for example crystalline ceramic particles or glass particles, and that a proportion of the particles have maximum dimensions lower than 100 nanometers. It is particularly preferred that the solid particles are one or more metallic oxides or hydroxides of an element selected from the group comprising silicon, aluminium, titanium, iron, magnesium, tantalum, and the rare earth metals.

A further preferred method of forming an IMS according to an aspect of the invention comprises the steps of positioning the substrate in an electrolytic chamber containing a colloidal electrolyte comprising solid particles dispersed in an aqueous phase. The chamber also contains an electrode. At least the surface of the substrate and a portion of the electrode are arranged to be contacting the electrolyte. The method comprises the step of electrically biasing the substrate relative to the electrode for a predetermined period of time to generate a ceramic dielectric coating on the surface of the substrate. A series of bipolar electric pulses are applied, such that the polarity of the substrate cycles from being anodic with respect to the electrode to being cathodic with respect to the electrode. The ceramic coating is formed during periods of the cycle during which the substrate is anodic with respect to the electrode. Solid particles from the colloidal electrolyte have a characteristic isoelectric point, and the pH corresponding to this isoelectric point differs from the pH of the aqueous phase of the electrolyte by 1.5 or greater. During the application of the bipolar electric pulses, the solid particles migrate towards the surface of the substrate under the influence of an applied electric field and are incorporated into the non-metallic layer to form the non-metallic coating.

With relation to either method described above, the predetermined time during which the process is carried out may be any time required to provide a suitable thickness of coating for an intended purpose. Typically the predetermined time may be between 1 minute and 2 hours. The rate of development of the coating may depend on a number of factors including the waveform used to bias the substrate relative to the electrode, and the density and size of particles in the colloidal electrolyte, where the method employs a colloidal electrolyte. It is particularly preferable that the predetermined time is between 2 minutes and 30 minutes, for example between 3 minutes and 15 minutes.

An apparatus suitable for forming a dielectric coating on the surface of a metallic or semi-metallic substrate to form an IMS according to an aspect of the invention may comprise an electrolysis chamber for containing an aqueous electrolyte, an electrode locatable within the electrolysis chamber, and a power supply capable of applying a sequence of voltage pulses of alternative polarity between the substrate and the electrode. The power supply comprises a first pulse generator for generating a potentiostatically controlled sequence positive voltage pulses for anodically biasing the substrate with respect to the electrode. The power supply further comprises a second pulse generator for generating a galvanostatically controlled sequence of negative voltage pulses to cathodically bias the substrate with respect to the electrode.

It may be particularly advantageous that the apparatus further comprises a colloidal electrolyte comprising solid particles dispersed in an aqueous phase. As described above, the solid particles dispersed in such an electrolyte may become incorporated into the coating generated using the apparatus. The colloidal electrolyte may be any electrolyte as disclosed above in relation to the methods according to the invention.

The coatings developed using the methods disclosed above, or using the apparatus disclosed above, have unique properties compared with previously known dielectric coatings, for example coatings produced by the standard anodising processes or by PEO techniques. Thus, one aspect of the invention may further provide an IMS comprising a coating formed by any method described above or using the apparatus described above.

In a further aspect, the invention may provide a device incorporating or mounted onto an IMS according to any aspect above. An IMS according to the invention has superior dielectric and thermal conductivity properties compared to prior art IMSs, and devices mounted upon one may operate more efficiently due to the improved thermal transfer from components of the device through the IMS. Such thermal transfer may be achieved by a combination of improved dielectric strength of the coating on the IMS, which allows the coating to be thinner while providing electrical insulation, and an improved thermal conductivity of the material. An ability to apply an insulating layer directly onto the surface of a heat sink, heat pipe, cooling device, luminary frame or body enables devices to be formed having a minimal thermal path between working semiconductor elements and metal heat sinking elements. Examples of such devices include chip-on-heat sink, chip-on-heat pipe, chip-on-cooler, and chip-on-frame devices.

For certain applications, an IMS having a multilayered structure may prove advantageous. For example, an IMS may be formed according to any aspect or embodiment described above, and this IMS may then form the base of a multilayered IMS. An additional layer or layers of dielectric material and associated metal conducting layers may then be formed on the top of metal layer of the base IMS. The additional dielectric layer or layers may be, for example, FR-4 fibreglass laminates, or a fluoropolymer or polyimide layer. Electronic devices may advantageously be attached to the non-metallic coating of the base IMS (i.e. the non-metallic coating formed according to the electrolytic process described above), which provides high thermal conductivity. The multilayered structure formed on the base IMS may enable a large number of external connections to be made.

PREFERRED EMBODIMENTS OF THE INVENTION

Figure 2:
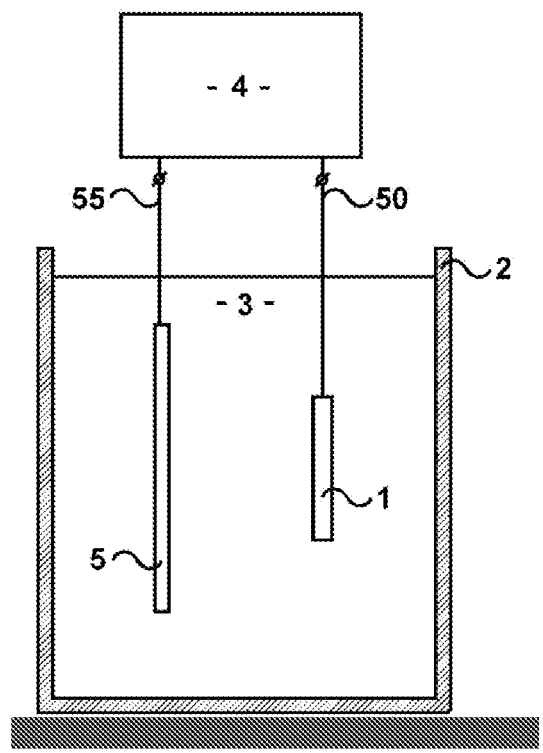
Figure 3:
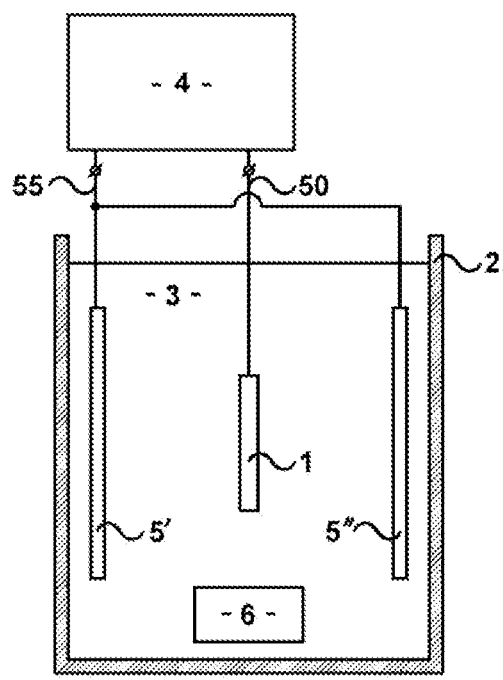
Figure 4:
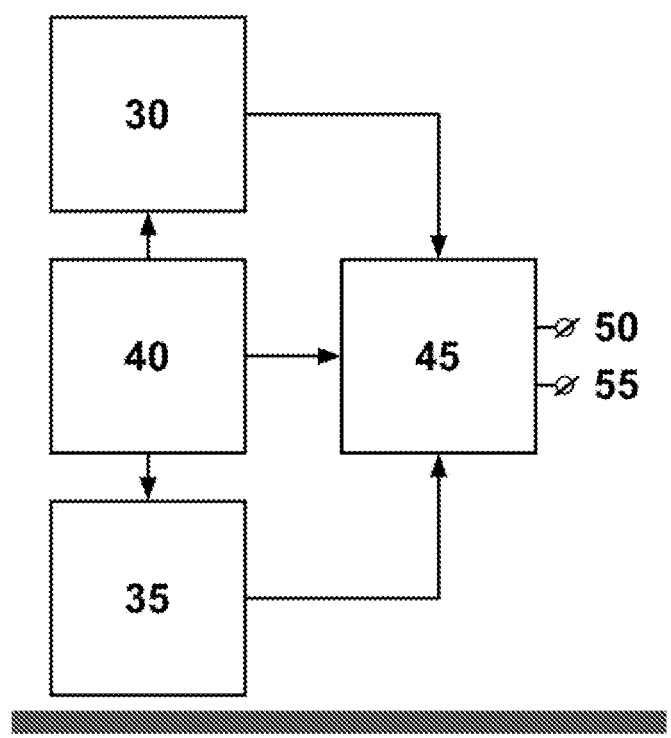
Figure 5:
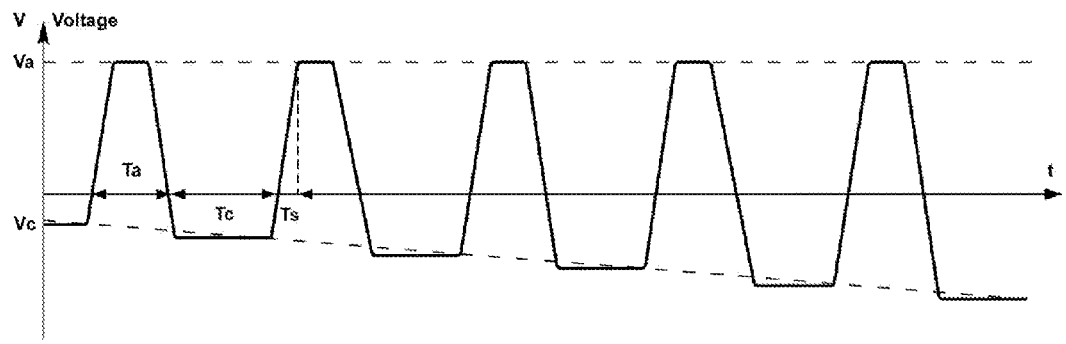
Figure 6:
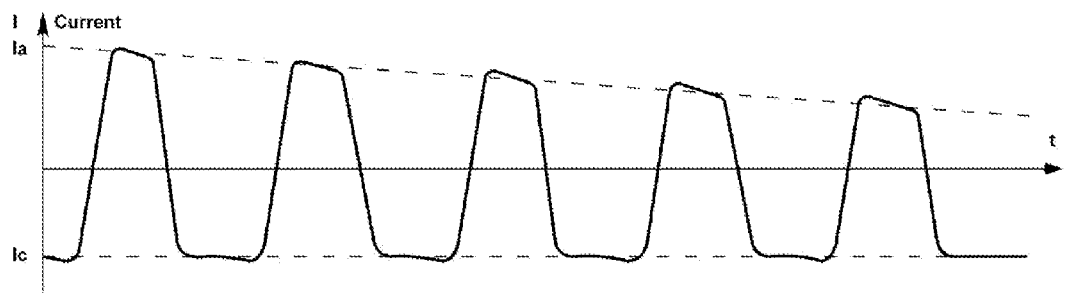
Figure 7:
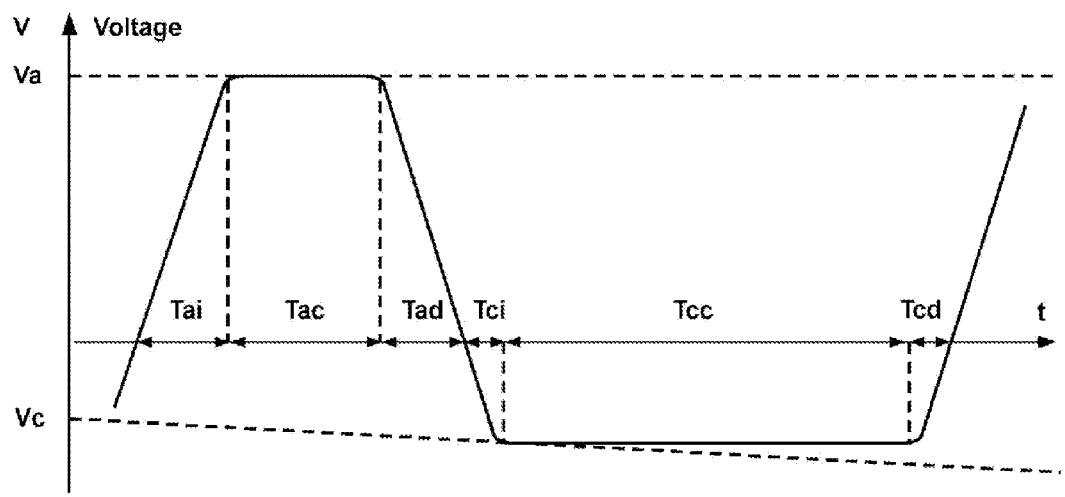
Figure 8:
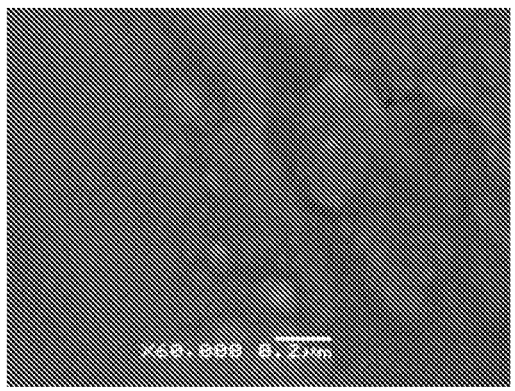
Figure 9:
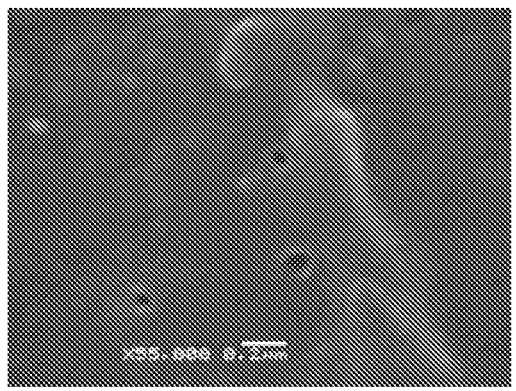
Figure 10:
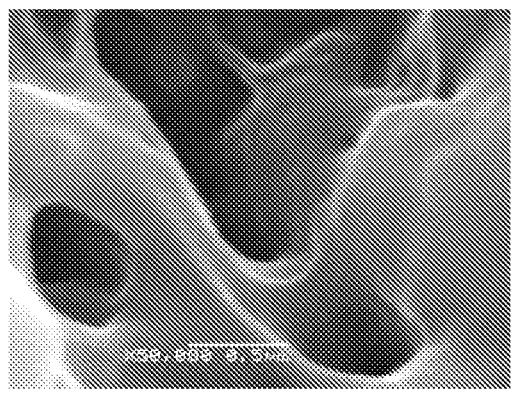
Figure 11:
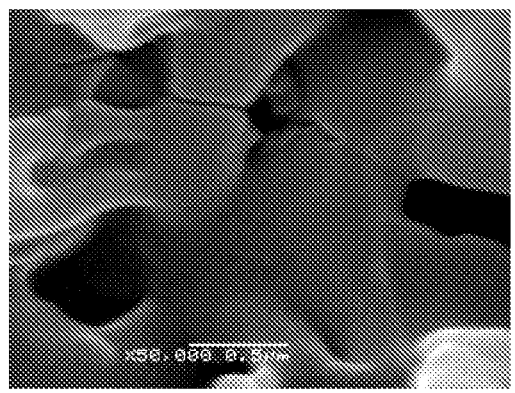
Figure 12:
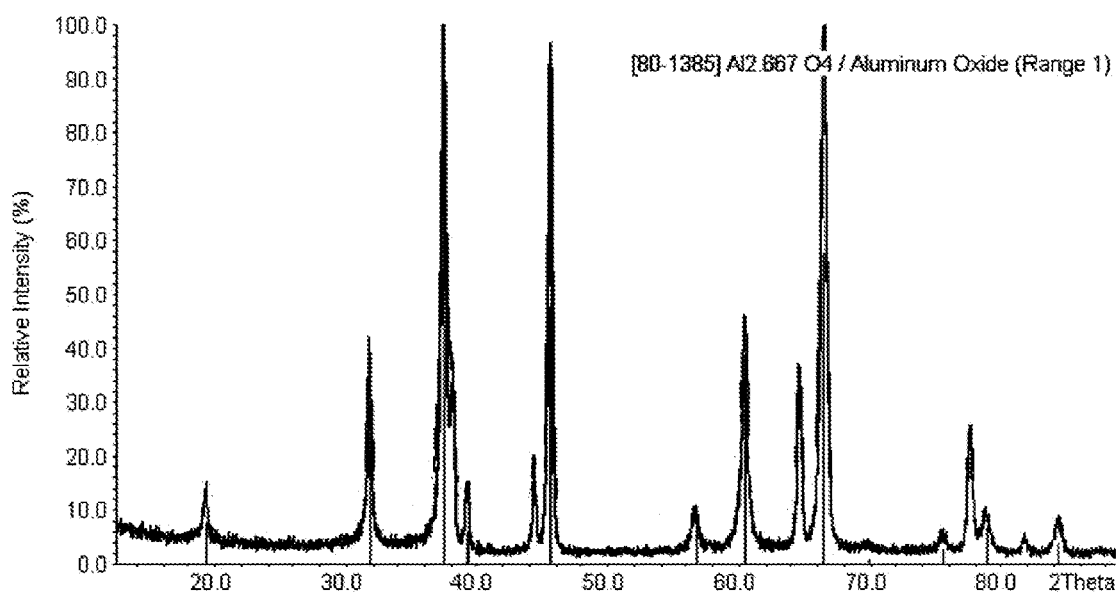
Figure 13:
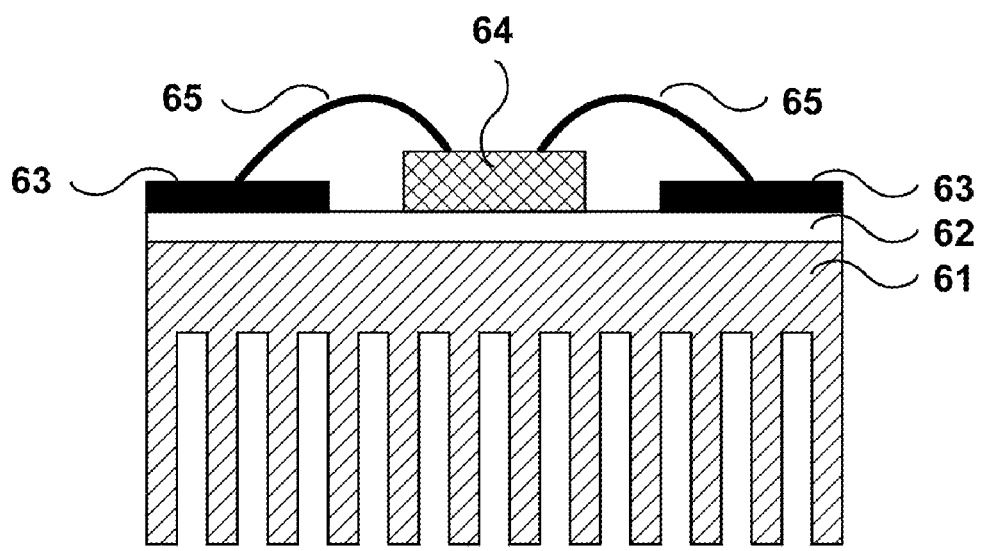
Figure 14:
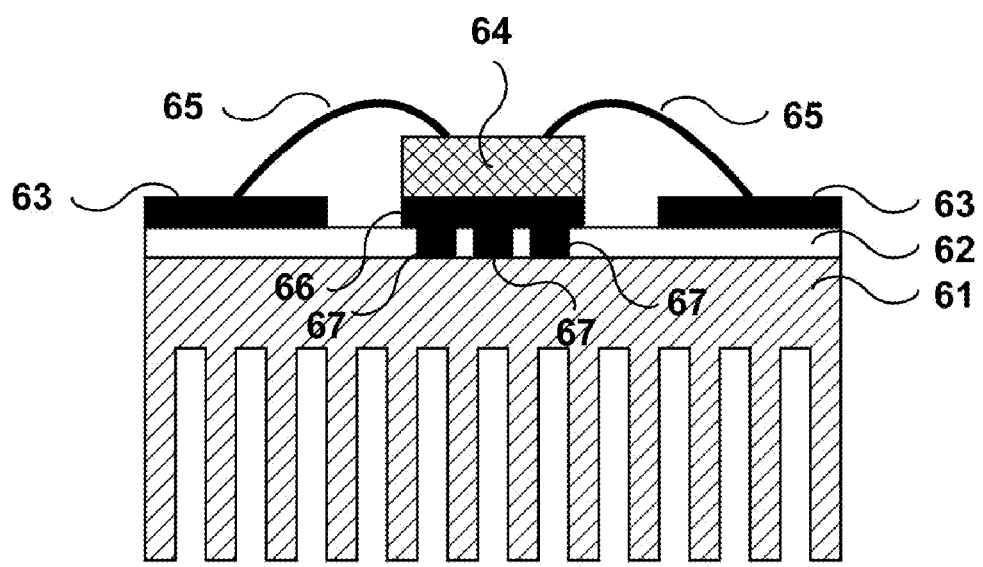
Figure 15:
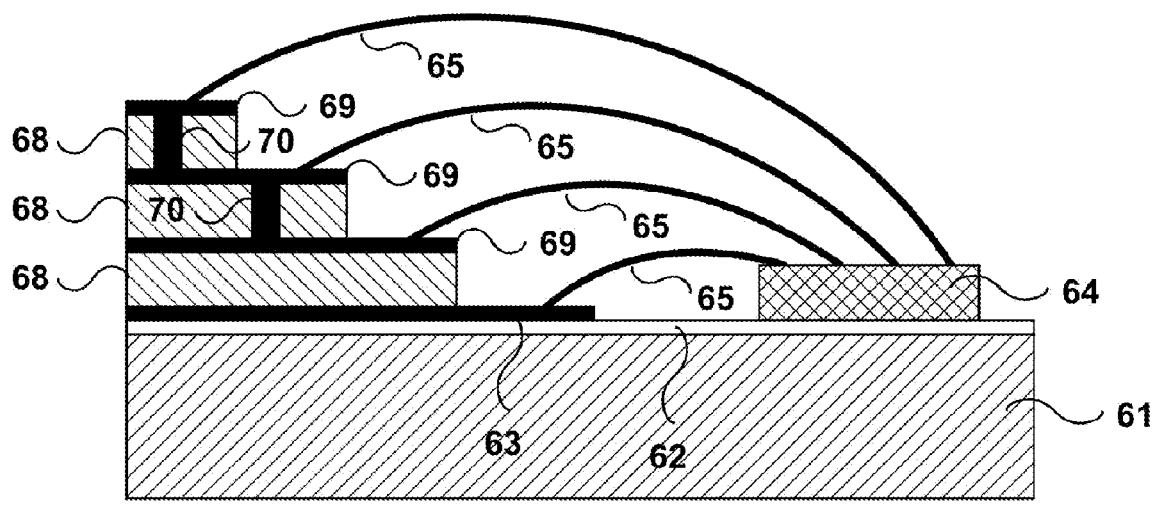
Figure 16:
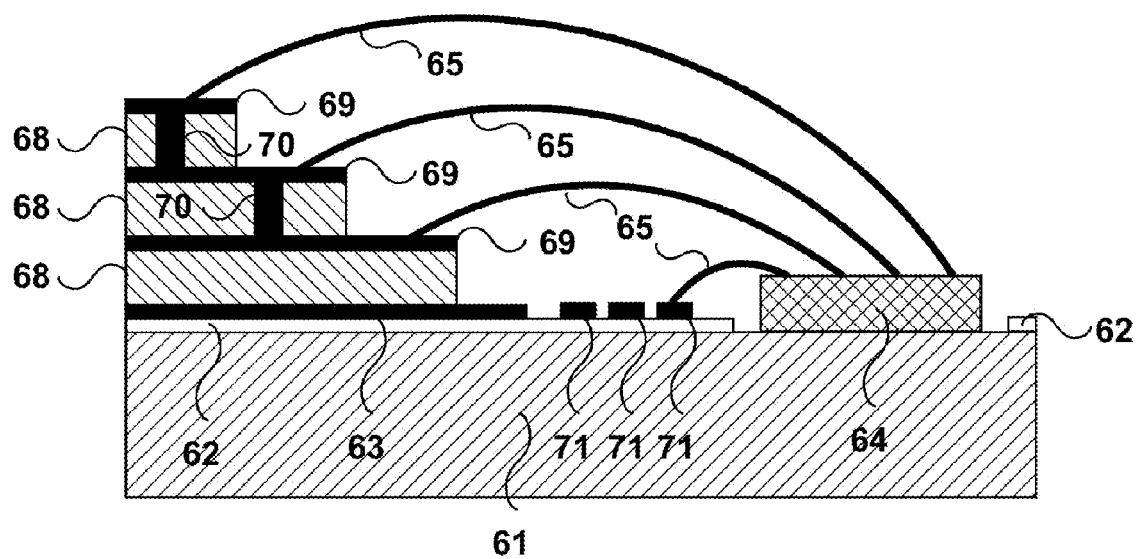

Preferred embodiments of the invention will now be described with reference to the figures, in which;

FIG. 1 is a schematic diagram illustrating the layers of an insulated metal substrate (IMS) embodying the invention, FIG. 2 is a schematic illustration of an electrolytic apparatus suitable for forming a ceramic coating on the surface of a metallic substrate to form an IMS embodying the invention, FIG. 3 is a schematic illustration of an electrolytic apparatus suitable for forming a ceramic coating on the surface of a metallic substrate to form an IMS embodying the invention, FIG. 4 is a schematic diagram of an electronic power supply suitable for use with the apparatus of FIG. 2 or FIG. 3, FIG. 5 illustrates a preferred voltage waveform in for use in forming a ceramic coating on a metallic substrate, FIG. 6 is a schematic illustration of a current waveform corresponding to the voltage waveform illustrated in FIG. 5, FIG. 7 illustrates details of one positive voltage pulse and one negative voltage pulse from the waveform of FIG. 5, FIGS. 8 and 9 are typical scanning electron micrographs of a nanoceramic coating formed on an aluminium alloy as described in Example 1, FIGS. 10 and 11 are typical scanning electron micrographs of a ceramic coating formed on an aluminium alloy by a plasma electrochemical oxidation (PEO) process, showing the significant pore size associated with such a process, FIG. 12 is an X-ray diffraction (XRD) pattern of a nanoceramic coating formed on an aluminium alloy as described in Example 1, FIG. 13 is a side view of an IMS embodying the invention, on which an electronic device is mounted, FIG. 14 is a side view of an IMS embodying the invention, including thermal vias, on which an electronic device is mounted, FIG. 15 is a side view of a multilayered IMS embodying the invention, on which an electronic device is mounted having a large number of external connections, FIG. 16 is a side view of a multilayered IMS embodying the invention having built-in RF circuits, on which an electronic device is mounted.

FIG. 1 is a schematic illustration showing the structure of a specific embodiment of an IMS. The IMS 10 comprises a metal substrate 11, for example an aluminium substrate, that has a ceramic dielectric coating 12 formed on a surface of the substrate by any method described above. The ceramic coating is a crystalline coating having an average crystal size of less than 500 nanometers and may, therefore, be referred to as a nanoceramic coating. A metal contact layer 13 is formed on the surface of the nanoceramic coating 12.

The metal substrate may have different shapes and may have different functions. For example, the metal substrate may be a flat board for MC PCB use, the surface of a heat sink, the surface of a liquid cooled device, the surface of a heat pipe, or the surface of luminary frame. The skilled person may be aware of many further applications.

Table 1 above provides a comparison of dielectric properties between a non-metallic coating of an IMS according to the present invention and prior art dielectric coatings currently used for IMS applications.

As follows from table 1, nanoceramic coatings formed as the dielectric of an IMS according to an embodiment of the present invention have higher thermal conductivity than prior art IMS dielectrics. Moreover the relatively high minimal thickness of the prior art IMS dielectrics is excessive for low voltage applications, e.g. for LEDs. It will require only a 10 microns thickness of a nanoceramic coating as described herein to meet the requirements for 500 V DC breakdown voltage devices. The thermal resistance value of a 10 microns thick nanoceramic coating layer is less than 0.02° C. cm$^2$/W, which is significantly lower than the thermal resistance of the other dielectric layers in table 1.

A combination of higher thermal conductivity, dielectric strength and ability to tune the thickness of the coating within a broad range of 2-100 microns to meet necessary breakdown voltage requirement, provides that ability to create IMSs with unique thermal properties.

Specific embodiments of an IMS according to any aspect of the invention may be formed by generating a nanoceramic coating on a suitable metal or non-metal. For specific uses, an IMS may be formed by generating a nanoceramic coating and then further coating the nanoceramic coating with a contact metal layer or layers using known techniques.

FIG. 2 illustrates a typical apparatus suitable for forming a nanoceramic coating on a metallic or semi-metallic substrate 1 to form an IMS embodying the invention. The apparatus comprises a chemically inert tank 2, for example a tank formed from a stainless steel alloy, which contains an electrolyte solution 3. The electrolyte solution 3 is an aqueous alkaline electrolyte solution, for example an aqueous solution of sodium hydroxide or potassium hydroxide, and has an electrical conductivity of greater than 5 mS cm$^{-1}$. The electrolyte may be a colloidal electrolyte comprising solid particles, with a proportion of those particles having a particle size lower than 100 nanometers.

The substrate 1 is electrically connected to a first output 50 of a pulse power supply 4. An electrode 5 is connected to a second output 55 of the pulse power supply 4, and both the electrode 5 and the substrate 1 are immersed in the electrolyte solution 3 contained within the tank 2. The pulse power supply 4 is capable of supplying electrical pulses of alternating polarity in order to electrically bias the substrate 1 with respect to the electrode 5.

FIG. 3 illustrates an alternative electrolytic apparatus suitable for fabricating an IMS according to one or more aspects or embodiments of the invention. In common with the apparatus described above in relation to FIG. 2, the apparatus of FIG. 3 comprises a chemically inert tank 2 for containing an electrolyte solution 3. A substrate 1 is coupled to a first output 50 of a pulse power supply 4. A second output 55 of the power supply 4 is electrically connected to first and second electrodes 5' and 5", and the substrate 1 and the electrodes 5' and 5" are immersed in the electrolyte 3. The two electrodes 5', 5" are disposed on either side of the substrate 1 in order to generate a more even electric field over the surface of the substrate and produce a more even coating on both sides of the substrate.

It is noted that more than two electrodes may be coupled to an output of the pulse power supply 4 should this be desired. Likewise, more than one substrate may be simultaneously coupled to an output of the pulse power supply 4 so that more than one IMS may be formed at any one time.

The apparatus of FIG. 3 further comprises a heat exchanger 6 through which the electrolyte 3 is circulated. The heat exchanger 6 allows circulation of electrolyte 3 within the tank 2, and furthermore allows control of the temperature of the electrolyte.

A preferred pulse power supply, for use with an apparatus or method of forming an IMS embodying the invention, is capable of supplying separate positive and negative voltage pulses between the substrate and an electrode. A schematic diagram of a preferred pulse generator is illustrated in FIG. 4.

The pulse power supply of FIG. 4 comprises two separate insulated gate bipolar transistor (IGBT) based generators and is a preferred pulse power supply for the apparatus of FIG. 2 or 3. A first generator, or anodic generator, 30 acts a generator of anodic pulses, i.e. pulses that anodically bias the substrate, or substrates, with respect to the electrode, or electrodes. A second generator, or cathodic generator, 35 acts as a generator of cathodic pulses, i.e. pulses that cathodically bias the substrate, or substrates, with respect to the electrode, or electrodes.

The anodic pulse generator 30 and the cathodic pulse generator 35 are independently controlled and synchronised by means of a controller 40. The anodic pulse generator 30 generates trapezoidal-shaped pulses having a fixed voltage amplitude, i.e. the voltage amplitude of the pulses generated by the anodic pulse generator 30 is potentiostatically controlled.

The cathodic pulse generator 35 provides trapezoidal-shaped pulses in which the mean cathodic current is maintained at a fixed value over successive pulses, i.e. the cathodic pulse generator 35 generates pulses that are galvanostatically controlled.

An output switch 45 comprising an H-bridge electronic circuit, couples the anodic pulse generator 30 and the cathodic pulse generator 35 to a first output 50 and a second output 55. During use, the first output 50 is electrically coupled to a substrate and the second output 55 is electrically coupled to one or more electrodes. The controller 40 synchronises the output of the anodic pulse generator 30 and the cathodic pulse generator 35 and allows the output switch 45 to produce an output waveform comprising a sequence of positive and negative trapezoidal-shaped voltage pulses as illustrated in FIG. 5.

Simultaneous use of potentiostatic control for positive (anodic) pulses and galvanostatic control for negative (cathodic) pulses enables a gradual increase in a ratio between the power of cathodic and anodic pulses over the duration of the process, and this creates conditions allowing high energy process without of generation of micro-discharges.

A particularly preferred waveform for use in a method of producing an IMS according to one or more aspects or embodiments of the invention is illustrated by FIGS. 5, 6 and 7.

FIG. 5 illustrates a waveform consisting of a sequence of alternating positive and negative voltage pulses generated over a period of time. Positive voltage pulses are substantially trapezoidal in shape and have a positive pulse interval ($T_a$) as indicated in FIG. 5. When applied between a substrate and an electrode, positive voltage pulses cause the substrate to be anodically biased relative to the electrode. Successive positive voltage pulses are controlled to have substantially the same voltage amplitude ($V_a$).

Negative voltage pulses are substantially trapezoidal in shape and have a negative pulse interval $T_c$. When applied between a substrate and an electrode, negative voltage pulses cause the substrate to be cathodically biased relative to the electrode. Successive negative voltage pulses are controlled to have substantially the same current amplitude ($I_c$ in FIG. 6).

The amplitude of each successive negative voltage pulse is controlled to be a voltage at which a constant level of current flows across the electrolyte. The application of the waveform results in a non-metallic coating being formed on the surface of the substrate. As the coating grows thicker, its electrical resistance increases and the voltage required to pass the same amount of current increases. Thus, the amplitude of successive cathodic voltage pulses ($V_c$) increases over a period of time.

FIG. 6 is a diagram showing the current waveform that corresponds to the voltage waveform illustrated in FIG. 5. When a positive voltage pulse is applied a positive current is deemed to flow, and when a negative voltage is applied a negative current is deemed to flow. The positive voltage pulses are potentiostatically controlled, such that the amplitude of each successive pulse is substantially the same. Over a period of time the thickness of the coating on the surface of the substrate increases, and the current driven by this voltage decreases. Thus, the positive current pulse amplitude ($I_a$) associated with the positive voltage pulses tend to decrease over the period of time.

As discussed above in relation to FIG. 5, negative voltage pulses are controlled galvanostatically, and thus these pulses are controlled to have a constant current amplitude ($I_c$).

FIG. 7 illustrates a portion of the waveform of FIG. 5 showing one positive voltage pulse and one negative voltage pulse. Each positive voltage pulse is substantially trapezoidal in shape and has an interval ($T_{ai}$) during which the voltage rises from zero to the positive or anodic voltage amplitude ($V_a$). Each positive voltage pulse has an interval ($T_{ac}$) during which constant voltage is applied. This constant voltage is applied at the voltage amplitude of the pulse ($V_a$). Each positive voltage pulse further comprises an interval ($T_{ad}$) during which the voltage decreases from the voltage amplitude ($V_a$) to zero. The intervals ($T_{ai}$) and ($T_{ad}$) may be varied to control the current flow associated with the voltage pulse. It is highly undesirable that current spikes are generated during voltage pulses as current spikes promote the breakdown of the growing coating and cause micro-discharge or plasma generation. Micro-discharge events have a deleterious effect on the quality of the dielectric coating formed on the substrate.

Each negative voltage pulse is substantially trapezoidal in shape and comprises three intervals analogous to the three intervals described in relation to the positive voltage pulses. Each cathodic voltage pulse has an interval ($T_{ci}$) during which voltage is increased from zero to the cathodic voltage amplitude ($V_c$) of that pulse, an interval during which the cathodic voltage remains at the cathodic voltage amplitude ($V_c$) and an interval ($T_{cd}$) during which the voltage decreases from the voltage amplitude ($V_c$) to zero. The voltage amplitude ($V_c$) is determined with respect to the current flow at the voltage. Thus, the voltage amplitude ($V_c$) tends to increase over a period of time, as illustrated in FIG. 5.

The waveforms illustrated in FIGS. 5, 6 and 7 have a number of variables that may be controlled to influence the physical and electrical properties of the coating formed. The duration of both the positive and negative voltage pulses ($T_a$ & $T_c$) may be independently controlled. The intervals ($T_{ai}$, $T_{ac}$, $T_{ad}$, $T_{ci}$, $T_{cc}$ and $T_{cd}$) associated with the positive and negative voltage pulses can be controlled in order to substantially eliminate current pulse sparks and micro-discharge. The amplitude of the positive voltage pulses ($V_a$) may be controlled, as may the current flow at the peak voltage of each of the negative voltage pulses ($I_c$). Furthermore, the frequency of the pulses may be varied within a range of 100 Hz to 20 KHz.

FIGS. 2 to 7 and the accompanying text describe apparatus and a preferred waveform suitable for generating a nanoceramic coating on the surface of a metallic or semi-metallic substrate in order to form an IMS. Specific embodiments of IMSs according to one or more aspects of the invention are described in the following examples. These examples were formed using apparatus as illustrated in FIG. 2 or 3, including the pulse generator illustrated in FIG. 4, and using the specific waveforms as illustrated in FIGS. 5 to 7. In all examples, the colloidal solutions comprise some solid particles with a particle size lower than 100 nanometers.

Example 1

Example 1 illustrates the formation of a nanoceramic coating on a metallic substrate that would be suitable for use as the dielectric of an IMS embodying the invention.

A substrate in the form of a plate of Al 6082 alloy having dimensions of 50 mm×50 mm×1 mm was treated in an apparatus as described above and illustrated in FIG. 2. The apparatus comprised a tank containing an electrolyte, and the substrate and an electrode were coupled to a pulse power supply as described above and illustrated in FIG. 4. The substrate and the electrode were arranged in contact with the electrolyte.

The electrolyte was an aqueous solution containing 1.8 g/l of KOH and 1.0 g/l of Alumina particles, forming a stabilised colloidal solution.

The Pulse Generator applied a sequence of trapezoidally-shaped voltage pulses of alternating polarity between the substrate and the electrode. Positive voltage pulses were applied having a fixed positive voltage amplitude ($V_a$) of 700 V, and negative voltage pulses had a negative voltage amplitude ($V_c$) continuously grown from 0 to 350 V. The pulse repetition frequency was 2.5 KHz.

The pulses were applied for 8 minutes and a nanoceramic coating was formed on the surface of the substrate.

The nanoceramic coating was characterised and had the following characteristics:

The nanoceramic coating had a smooth surface profile. FIG. 8 illustrates an SEM micrograph showing a portion of the coating at a magnification of 60,000 times. It can be seen that the surface is substantially smooth at this magnification. FIG. 9 is a further SEM micrograph showing a portion of the coating at a magnification of 55,000 times. Pores in the coating having a size of between 50 an 150 nanometers can be seen. Pores of this dimension may be termed nano-pores.

For comparison, FIGS. 10 and 11 show SEM micrographs of a coating formed on the surface of an aluminium alloy by means of a plasma electrochemical oxidation (PEO) process. These micrographs are at a magnification of 50,000 times. The surface of the PEO coating can be seen to be extremely rough at this magnification. Pores formed by plasma bulbs can be seen to have a size of greater than 500 nanometers, in great contrast to the coating illustrated in FIGS. 8 and 9.

The coating thickness was 20 micrometers and its hardness was measured to be 1550 Hv. An XRD analysis of the coating (FIG. 12, revealed that the composition of the coating was aluminium oxide and that the coating having mean crystalline grain size of 40 nm. The average crystalline size was calculated on the base of the XRD data according to the Scherrer equation (B. D. Cullity & S. R. Stock, *Elements of X-Ray Diffraction*, 3$^{rd}$ Ed., Prentice-Hall Inc., 2001, p 167-171).

The breakdown voltage of the coating was measured to be 1800 V DC and the dielectric strength was measured to be 90 KV/mm.

Thermal conductivity of the ceramic material was measured to be 6 W/mK. Dielectric constant of the ceramic material was measured to be 9.5.

Example 2

FIG. 13 illustrates the use of an IMS embodying the invention as a metal heat sink for a high power device 64 such as for example a high-brightness light-emitting-diode (HB LED) chip. This may be described as a chip on heat sink application.

A nanoceramic dielectric coating 62 is applied on a flat surface of a metal heat sink 61 to form an IMS. The nanoceramic coating is formed using the method described above in example 1. Metal contact tracks with pads 63 are then formed on the surface of the nanoceramic coating 62.

The device 64 is attached directly to the nanoceramic coating 62, which provides electrical insulation between the chip and the metal heat sink 61. Contact connectors 65 are attached to connect the device 64 with the contact pads 63. The thickness of the nanoceramic coating is determined by the breakdown voltage requirement of the device, and is grown to the minimum thickness that meets the breakdown voltage requirement. This provides the shortest thermal path between non-insulated semiconductor components in the chip, which generate heat, and the metal heat sink 61.

Example 3

FIG. 14 illustrates the use of an IMS embodying the invention as a metal heat sink for a packaged device 64, or a chip requiring a low resistance ground path.

A nanoceramic dielectric coating 62 is applied on a flat surface of a metal heat sink 61 using the method described above in example 1, the metal heat sink 61 acting as a metal substrate for the nanoceramic coating 62. Metal contact tracks with pads 63 and a metal pad 66 are then formed on the surface of the nanoceramic coating 62. Thermal vias 67 defined through the nanoceramic coating 62 have metallic cores that connect the metal pad 66 and the metal heat sink 61.

The device 64 is attached to the metal pad 66 and contact connectors 65 are attached to contact pads 63.

Example 4

FIG. 15 illustrates the use of an IMS embodying the invention as part of a multilayered IMS board for a chip requiring a large number of external connections. An aluminium plate 61 acts as a metal substrate and performs a heat sinking function. A dielectric nanoceramic coating 62 is formed on one side of the aluminium plate 61, using the method described in example 1 above, and metal tracks 63 are formed on the surface of the nanoceramic coating 62.

Further dielectric layers 68 made of FR4 fibreglass (although other suitable materials may be used) are mounted on the top of the metal tracks 63, and further metal tracks 69 are formed on the surface of successive fibreglass dielectric layers. Metal tracks may be interconnected by signal vias 70 that are defined through fibreglass dielectric layers 68.

A chip 64 is attached directly to the surface of the nanoceramic dielectric coating 62, which provides low thermal resistance between the chip 64 and the aluminium substrate 61. Electrical signals necessary to control the chip are fed through the metal tracks 69 and 63, providing a high degree of integration of the system. Contact connectors 65 are attached to connect the device with various contact pads (metal tracks 69 and 63).

Example 5

FIG. 16 illustrates a multilayered board for a radio chip with high thermal emission and high-frequency input output signals. An aluminium carrier plate 61 acts as a metal substrate for the formation of a nanoceramic dielectric coating 62, and also performs both a heat sink function as well as a function of a radio frequency (RF) ground plane.

A dielectric nanoceramic coating 62 is formed selectively on one side of the aluminium carrier plate 61 to form an IMS (using the method described in example 1 above), and this IMS is used as a high Q dielectric media to carry RF signals. Metal tracks 63 are formed on the surface of the nanoceramic coating 62 and are used as a RF transmission lines.

Further metal tracks 71 are formed on the surface of the dielectric coating 62 and act as RF de-coupling and/or matching circuits 71.

Further dielectric layers 68 formed from FR4 fibreglass are located on the top of the metal tracks 63, with further metal tracks 69 formed on the surface of each of the fibreglass dielectric layers 68. This forms a fibreglass laminate structure. Metal tracks 69 may be interconnected by signal vias 70 defined through one or more of the fibreglass dielectric layers 68.

Low frequency and/or digital signals necessary to control the chip are fed through metal tracks 69 in the fibreglass laminate, providing a high degree of integration of the system. The chip 64 is attached directly to the surface of the base metal plate 61. RF circuits 71 are formed on the surface of the dielectric nanoceramic layer 62. The dielectric nanoceramic coating 62 provides high-Q input output transmission lines, used for RF de-coupling and/or matching circuits and low thermal resistance. Wirebonds 65 couple the chip 64 with contact tracks 69 and pads of the RF circuits 71.

The invention claimed is:

1. An insulated metal substrate (IMS) for supporting one or more devices, the IMS comprising:
    a metallic substrate having nanoceramic coating and a metal contact layer formed on a surface of the nanoceramic coating, the nanoceramic coating being formed at least in part by an electrolytic oxidation of a portion of a surface of the metallic substrate,
    the electrolytic oxidation occurring under conditions in which micro-discharge is avoided, the nanoceramic coating having,
    a thickness of between 500 nanometers and 500 micrometers, a crystalline structure with an average grain size of less than 500 nanometers, pores defined in the surface of the nanoceramic coating with an average diameter of less than 500 nanometers, and a dielectric strength of greater than 50 kV mm$^{-1}$ and a thermal conductivity of greater than 5 W/mK.

2. The IMS according to claim 1, wherein the pores have an average diameter of less than 400 nanometers.

3. The IMS according to claim 1, wherein the dielectric strength is between 50 and 120 kV mm$^{-1}$, and the thermal conductivity is between 5 and 14 W/mK.

4. The IMS according to claim 1, wherein the nanoceramic coating has a dielectric constant of greater than 7.

5. The IMS according to claim 1, wherein the average grain size is less than 250 nanometers.

6. The IMS according to claim 1, wherein the one or more devices is an electronic device, an optoelectronic device, an RF device, a microwave device or an electrical device.

7. The IMS according to claim 1, wherein the thickness of the nanoceramic coating is less than 50 micrometers.

8. The IMS according to claim 1 supporting at least one electronic circuit.

9. The IMS according to claim 1, wherein the nanoceramic coating has thickness less than 11 microns, a breakdown voltage greater than 500 V DC and a thermal resistance less than 0.02° C. cm$^2$/W, or wherein the nanoceramic coating has thickness less than 31 microns, a breakdown voltage greater than 1.5 kV DC and a thermal resistance less than 0.07° C. cm$^2$/W.

10. The IMS according to claim 1, wherein the metal contact layer is formed by at least one of screen printing, metal ink printing, electroless metallisation, galvanic metallisation, adhesive bonding of metal foil, bonding of prefabricated flex circuits, chemical vapour deposition (CVD) and plasma vapour deposition (PVD) metallisation.

11. The IMS according to claim 1, wherein the metal of the substrate is at least one of aluminium, magnesium, titanium, zirconium, tantalum, beryllium, and an alloy or intermetallic of any of these metals.

12. The IMS according to claim 1, wherein the pores within at least a portion of the nanoceramic coating are impregnated with organic or non-organic material.

13. The IMS according to claim 12, wherein the pores are impregnated by at least one of dipping, spraying, vacuum sealing, screen printing, Plasma Vapour Deposition and Chemical Vapour Deposition.

14. The IMS according to claim 1, wherein metallic thermal vias connect the metal contact layer with the metallic substrate.

15. The IMS according to claim 1, wherein the metallic substrate is at least one of a board, a luminary body, a luminary frame, a heat sink, a heat pipe, and a liquid-cooled device.

16. The IMS according to claim 1, further comprising a multilayer metal-dielectric structure formed on the nanoceramic coating.

17. The IMS according to claim 1, wherein the nanoceramic coating is formed by electrically biasing the metallic substrate with respect to an electrode in an aqueous electrolyte, the metallic substrate being biased by a sequence of voltage pulses of alternating polarity.

18. The IMS according to claim 17, wherein positive voltage pulses are potentiostatically controlled and negative voltage pulses are galvanostatically controlled.

19. The IMS according to claim 18, wherein a pulse repetition frequency of the positive voltage pulses and the negative voltage pulses is between 0.1 and 20 kHz, preferably between 1.5 and 4 kHz.

20. The IMS according to claim 1, wherein the nanoceramic coating is formed in part by the electrolytic oxidation process while the metallic substrate is in contact with an aqueous colloidal electrolyte, in which colloidal particles dispersed within the colloidal electrolyte are incorporated in the nanoceramic coating.

21. The IMS according to claim 1 having a maximum operating temperature in excess of 500° C.

22. The IMS according to claim 1 for supporting more than one electronic chip.

23. A device incorporating or mounted on the IMS according to claim 1.

24. A multilayered hoard for a chip comprising the IMS according to claim 1.

25. A device comprising RF components and circuits formed on the surface of the IMS according to claim 1, the device comprising high-Q input/output transmission lines, RF de-coupling and matching circuits.

26. A device comprising at least one light emitting diode mounted on a heat sink formed from the IMS according to claim 1.

27. The IMS according to claim 1, wherein the pores have an average diameter of less than 300 nanometers.

28. The IMS according to claim 1, wherein the pores have an average diameter of less than 200 nanometers.

29. The IMS according to claim 1, wherein the average grain size is less than 100 nanometers.

30. The IMS according to claim 1, wherein the thickness of the nanoceramic coating is less than 20 micrometers.

31. The IMS according to claim 1, wherein the thickness of the nanoceramic coating is less than 10 micrometers.

32. The IMS according to claim 12, wherein the pores are impregnated with at least one of polyimide, methacrylate, epoxy resin, sealing glass, and sol-gel materials.

* * * * *